United States Patent
Ormson

(10) Patent No.: US 8,041,352 B2
(45) Date of Patent: Oct. 18, 2011

(54) FREQUENCY CONTROL

(75) Inventor: Richard Gavin Ormson, Berkshire (GB)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 1013 days.

(21) Appl. No.: 11/979,802

(22) Filed: Nov. 8, 2007

(65) Prior Publication Data

US 2008/0125118 A1 May 29, 2008

(30) Foreign Application Priority Data

Nov. 29, 2006 (EP) .................................. 06125011

(51) Int. Cl.
*H04W 4/00* (2009.01)
(52) U.S. Cl. ... 455/434; 455/13.2; 455/63.3; 455/432.1; 455/435.1; 455/436; 455/455; 370/310.2; 370/324; 370/328; 370/329; 370/331
(58) Field of Classification Search .............. 455/432.1, 455/434, 435, 436, 455, 13.2, 63.3; 370/310.2, 370/324, 328, 329, 331
See application file for complete search history.

(56) References Cited

U.S. PATENT DOCUMENTS

| | | | | |
|---|---|---|---|---|
| 5,933,785 A | * | 8/1999 | Tayloe | ........................... 455/558 |
| 7,444,166 B2 | * | 10/2008 | Sahota | ........................ 455/553.1 |

FOREIGN PATENT DOCUMENTS

| | | |
|---|---|---|
| EP | 1 422 962 | 5/2004 |
| EP | 1 422 963 | 5/2004 |
| GB | 2 386 506 | 9/2003 |
| GB | 2 387 494 A | 10/2003 |
| GB | 2 387 507 | 10/2003 |
| GB | 2 395 622 | 5/2004 |
| GB | 2 425 233 | 10/2006 |

OTHER PUBLICATIONS

European Search Report dated May 10, 2007.

* cited by examiner

*Primary Examiner* — Steve D Agosta
(74) *Attorney, Agent, or Firm* — McGinn Intellectual Property Law Group, PLLC

(57) ABSTRACT

The invention provides for a mobile radio communications device, and related method, arranged for communication by way of at least two RATs and having at least first and second RAT systems and related respective automatic frequency controls for control of an internal clock of the device, the mobile radio communications device further including a search frequency controller for controlling the internal clock during an initial network search, the frequency controller and related method steps being arranged to be initiated at a nominal correction value at the start of the search procedure, and to depart from the said nominal value responsive to one of a receipt of a valid frequency error reading, or receipt of a request for a raster step during an initial network search procedure.

24 Claims, 3 Drawing Sheets

FREQUENCY CONTROL

BACKGROUND OF THE INVENTION

1. Field of the Invention

The present invention relates to frequency control procedures within an at least dual-mode mobile radio communications device and, in particular, to such a mobile radio communications device including such frequency control means, and a related method of frequency control.

2. Description of Related Art

As is commonly known, the period between which a mobile radio communications device such as a cell phone handset is turned on, and the time at which the device actually acquires a network for communication purposes, is considered dead time from the user's perspective. This can cause irritation and frustration.

While from a user's perspective this period is considered wasted, the handset is nevertheless actively conducting a search through the variously available frequencies in an attempt to identify a relevant network. This search procedure is one that requires significant power expenditure within the handset. Thus with the advent of dual-mode, and the introduction of multi-mode handsets, there is a correspondingly increasing set of frequencies that have to be searched. The procedure for achieving connection to the most attractive cell of the most attractive network then takes proportionately longer, and thus the related energy consumption is proportionally higher.

While current 3GPP specifications require that a dual mode handset searches one complete Radio Access Technology (RAT) at a time, the relative priority given to the different RATs is generally set within the handset. Thus the usual scenario is that, subsequent to the dual-mode handset being activated by a user, the handset will initially search one specified network and will only commence the search of the other of the network if no suitable cells are located during the search of the first network.

Such initial searches generally seek to measure signal strength, or a derivative thereof, and the cells are effectively ranked in accordance with the strength of their signals as detected by the handset. It is generally required that five measurements are taken for each signal frequency spread over a period of at least three seconds so as to arrive at an average reading.

Considering the EGSM 900 band, which contains 172 frequencies, and GSM 1800 band, which contains 374 frequencies, the following is an illustrative example.

The time taken to tune to a frequency and perform relevant signal strength measurements is in the order of 350 us such that the entire frequency set for the two aforementioned GSM frequency bands can be measured in 0.19 seconds. In order to perform the required five measurements to arrive at an average value, a time interval in the order of 0.95 seconds is therefore required. Given the above-mentioned minimum three second averaging period, this leaves just over two seconds of that period which can be employed for other purposes.

Turning to FIG. 1, there is provided a flow diagram illustrating currently known search procedures which, for simplicity, illustrate the operation according to the current art in accordance with two RATs.

The procedure starts at step 1 with activation of the search and, subsequent to that, Automatic Frequency Control (AFC) is initiated with an initial setting of 0 ppm and a selection of the first RAT to be searched is to be made at step 2.

Depending upon which RAT is selected for the initial searching activity, the procedure continues via steps 3A-7A, or 3B-7B each respective step is however, the same in each of the two series.

That is, subsequent to selection at step 2 of the RAT that is to be searched first, the process continues at step 3A, B with application of the appropriate AFC setting. The search then starts, or continues (see later), at step 4A, B and proceeds to a determination at step 5A, B as to whether the AFC has been updated.

If at step 5A, B the AFC has been updated, then the process returns to step 3A, B so as to apply the updated AFC setting to the relevant RAT prior to continuation of the RAT search.

If, however, at step 5A, B it is determined that there has been no AFC update, the process continues to a determination at step 6A, B as to whether the search phase has been completed. If not, the process returns to step 4A, B for continuation of the RAT search. However if, at step 6A, B it is determined that the search phase has completed, a determination is next made at step 7A, B as to whether all searches for the relevant handset have been completed.

If all such searches have been completed, the process continues to step 8 where it is first determined whether or not a suitable cell has been identified and then, as appropriate, onto steps 9A, B to execute a "camp-on" step 9A, or an "end procedure" step 9B as appropriate.

Returning to step 7A, B, if it is here determined that not all possible searches have been exhausted, i.e. that searches need to be conducted in relation to an alternative RAT, then the procedure returns to step 3A, B as indicated by arrows so that a search phase for the other of the two RATs can be initiated. Once the search phase for both of the RATs is identified at step 7A, B has having been completed, the procedure will then continue to step 8 as noted above.

As an alternative to searching the available RATs in the above-mentioned sequential manner, efficiencies in operation can be realised by effectively interleaving the measurements between the different RATs so as to efficiently employ all the time available to the handset and thereby fill any gaps that might otherwise occur. GB-A-2 395 622 provides a description of such an arrangement.

When performing an initial network search, whether by way of a sequential or interleaved procedure, the control of the frequency of the internal clock of the handset is an important factor in performing the search.

Various AFC techniques have been employed in relation to dual-mode devices such as those discussed in the following.

With a handset logically connected to one of two possible RATs, the internal clock of the handset is locked to a clock signal as originating from the logically connected RAT. This is generally achieved by monitoring the difference between the internal clock and the over-the-air signals received from the RAT. When differences between the clock signals are identified, the local internal clock of the handset is adjusted so as to minimise such differences. Such AFC is commonly employed within an at least dual-mode handset and, at any particular time, the frequency of the internal clock is locked to the over-the-air signals from the RAT to which the handset is logically connected. This network is generally identified as the "master RAT" and if handover is to occur from this network to a different RAT, the current frequency setting of the internal clock is transferred, as a seed value, from the frequency controller of the master RAT to the frequency controller of the RAT, i.e. the slave RAT, to which handover is to be made. The RAT frequency controller previously associated with the slave RAT then takes control of the frequency of the internal clock using the clock value as transferred to it as a seed value.

For example, such an arrangement is known from GB-A-2 387 507. This technique takes advantage of the realisation that the transferred setting is known to be within the accuracy limits permissible in the slave RAT.

Of course, when the handset is first activated, and an initial network search is to be performed, there is no accurate value available to be used as a seed value since no network connection has yet been established. Without the benefit of a current network connection, each RAT generally has its own requirements and arrangements as to how the AFC should operate.

As an example, GSM requires the value to be fixed throughout the search procedure and generally relies upon an assumption that any clock frequency inaccuracy will be within the range of reception of the DSP equaliser software within the handset.

As a comparison, a WCDMA equaliser is known to be processing intensive even when running with an accurate clock signal and this translates into a requirement that the error should be relatively small, and generally smaller than those errors that are permissible for GSM systems. In view of this, and in order to search effectively for an initial network connection, it is necessary to raster the AFC setting during the search so as to ensure that all possible errors have been allowed for. For example, with a device handset with an internal clock accurate to ±6 ppm in the absence of AFC, and an equaliser capable of dealing with ±2 ppm error, the AFT correction would then be set to a nominal value, i.e. 0 ppm. For the first of the raster scans, this would allow the equaliser to analyse the range +2 ppm −2 ppm. For the second raster scan, the AFC would then be set to +4 ppm thus covering the range +2 ppm to +6 ppm. The final scan AFC would be −4 ppm and the equaliser would then be able to cover the range −2 ppm to −6 ppm.

As will be appreciated, these initial search procedures for the different RATs are quite different and exhibit quite different characteristics.

These approaches clearly lack compatibility particularly when considering interleaved RAT measurement scanning, and in a situation in which a currently active RAT has control of the AFC.

In particular, since there is currently no exchange of data between different RATs concerning their respective current AFC settings, when control moves from one RAT to the other, the search procedure adopted by each respective RAT maintains its own setting, and applies that setting when it is in control of the radio operation.

Since, as noted above, a 3G RAT will apply a raster step during its search procedure, whereas a 2G RAT will not apply any such step, the 3G section can be set to a +4 ppm (or −4 ppm) nominal value, while the 2G section will of course require use of a 0 ppm nominal value.

In view of this, and each time the RAT changes, the AFC would then have to undergo a step-change of 4 ppm. The time required to allow the internal handset clock to settle after such a relatively large change would prove particularly disadvantageous. In extremis, the clock setting time may be longer than the interval available to perform measurements, and attempting to interleave measurements becomes impossible.

SUMMARY

The present invention therefore seeks to provide a frequency control arrangement, and related method, that can be employed within a mobile radio communications device handset and which has advantages over known such methods and arrangements particularly with regard to aspects of power consumption and speed and efficiency of network search and acquisition.

According to a first aspect of the present invention there is provided a mobile radio communications device arranged for communication by way of at least two RATs and including at least first and second RAT systems and related respective automatic frequency controls for control of an internal clock of the device, the mobile radio communications device further including a search frequency controller for controlling the internal clock during an initial network search, the search frequency controller being operationally independent of the automatic frequency controls of the said at least first and second RAT systems.

As will be discussed further below, such a mobile radio communications device advantageously has the frequency of its internal clock controlled so as to allow the device to operate in a particularly efficient manner with regard to speed of network acquisition and power consumption, during an initial network search for network acquisition.

Through the provision of a specific search frequency controller, which does not form part of either of the first or second RAT systems, search procedures of greater time-efficiency can be realised if particularly an interleaved search strategy is to be employed.

In particular, the search frequency controller advantageously controls the frequency of the internal clock during an initial search procedure, i.e. until the identification of a RAT network to which the device is to attempt a camp-on procedure.

Further, when a determination is made via a handset that it is ready to camp-on to any particular located network, the AFC established by the search frequency controller can then be readily transferred as an appropriate seed value to the radio access network AFC of the relevant radio access network AFC controller.

Power and time savings can therefore be realised and potential user frustration limited.

Preferably the device can be arranged such that the search frequency controller is arranged to be initiated at a nominal correction value at the start of the search procedure, and to depart from the said nominal value responsive to one of a receipt of valid frequency error reading, or receipt of a request for a raster step.

Advantageously, the search frequency controller comprises an at least dual mode AFC module separate from the first and second RAT systems, and can be arranged such that a nominal correction value (usually 0 ppm) is initially applied.

The device is further arranged so as to report to the first and second RATs upon departure from the said nominal value.

Advantageously, the mobile radio communications device is arranged to employ a common algorithm into which frequency data, such as the frequency arising at the air interface, is input for both the first and second RAT systems. The algorithm can further be arranged to provide for the weighting of frequency data responsive to the RAT of origin. Of course such frequency data as mentioned above and referred to further hereinbelow can comprise an indication of the error between the received frequency and the frequency internal to the device.

In this manner, the operation of the device can be responsive to the different accuracies of the different RATs.

The search frequency controller is advantageously arranged such that, upon completion of the initial search, AFC control of the internal clock is transferred to the RAT system to which camp-on is to be attempted by the device.

The frequency data delivered by the search frequency controller advantageously serves as a seed value for the AFC setting of the RAT to which camp-on is to be attempted.

Yet further, the search frequency controller can be arranged to refuse any further raster-step requests should a valid frequency reading be received from one of the RAT systems.

The device can further be arranged to be responsive to the refusal of a raster request so as to control the RAT system from which the refused request originated to perform one further pass through the possible channel frequencies to confirm the presence/absence of active cells. If no further active cells are found, the search is then discontinued.

The search frequency controller can advantageously be arranged to perform a single raster interval step even if both of the said first and second RATs employ raster search procedures.

The initial search controller is then arranged to only implement a raster interval step should both the first and second RATs have requested the step.

This advantageously ensures that a step will not be taken in the middle of a search procedure on any one of the RAT systems.

As noted above, and as discussed in further detail below, the present invention has particular advantages over current AFC mechanisms.

Firstly, it provides for a more time-efficient search procedure, particularly where an interleaved search is performed. Further, it can serve to inhibit unnecessary raster steps and repeated searches both of which lead to significant saving in the time taken to perform the initial search. Then, the power required and potential end-user frustration can be reduced.

According to another aspect of the present invention there is provided a method of controlling the frequency of an internal clock of a mobile radio communications device arranged for communication by way of one of at least two RATs and having at least first and second RAT systems and related respective automatic frequency controllers for control of the internal clock of the device, the method including the step of controlling the clock frequency during an initial search procedure in a manner independent of the automatic frequency controllers of the first and second RATs.

Preferably the clock frequency during the initial search procedure is controlled so as to be initiated at a nominal correction value at the start of the search procedure, and to depart from the said nominal value responsive to one of the receipt of a valid frequency error reading, or receipt of a request for a raster step.

As above, the method advantageously allows the frequency of the device clock to be controlled in a manner such that the device to operate in a particularly efficient manner with regard to speed of network acquisition and power consumption, during an initial network search and subsequent acquisition.

The method includes initiating the search frequency controller with a nominal correction value of 0 ppm.

As a further step, the device can be arranged so as to report to the first and second RATs upon departure from the said nominal value.

Frequency data can be input into a common algorithm for both the first and second RAT systems.

As above, the algorithm can be arranged to provide for the weighting of frequency data responsive to the RAT of origin and which allows for the operation of the device to be responsive to the different accuracies of the different RATs.

The method further includes the step of transferring control to the RAT system to which camp-on of the device is to be attempted upon completion of the initial search procedure. In this manner, the frequency data delivered by the search frequency controller is employed as a seed value for the AFC setting of the RAT to which camp-on is to be attempted.

Advantageously the method controls the device to be responsive to refusal of a raster request to control the RAT system from which the refused request originated to perform a further pass through the possible channel frequencies to confirm the presence/absence of active cells.

As with the device described above, the method can be arranged to perform a single raster interval step irrespective of whether both of a first and second RATs employ raster search procedures.

Then, as above, the search frequency controller is arranged to only implement a raster interval step should the first and second RATs have requested the step.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The invention is described further hereinafter, by way of example only, with reference to the accompanying drawings in FIG. 2 and FIG. 3

Figure 2:
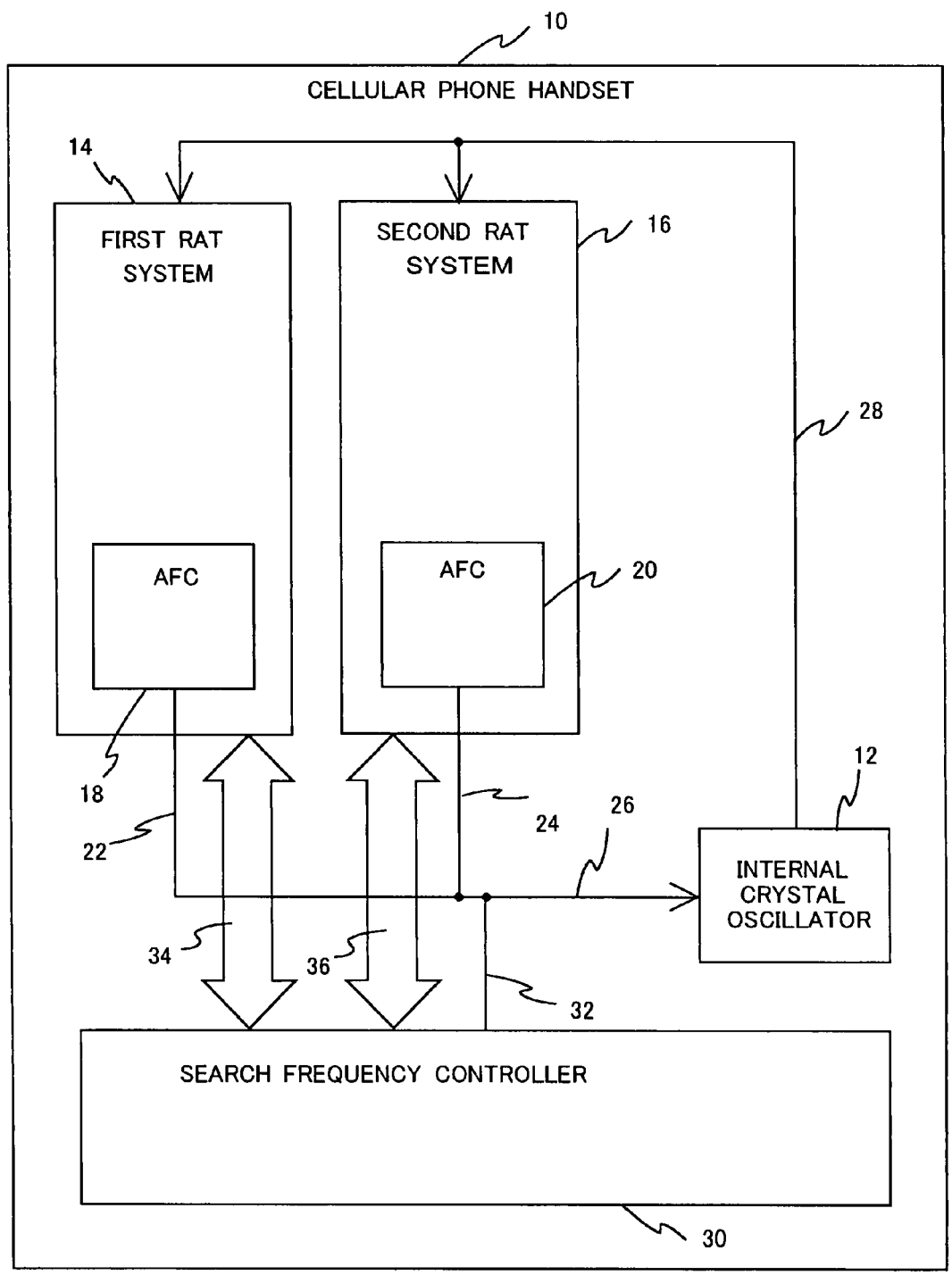
FIG. 2 is a schematic block diagram of a mobile radio communications device according to an embodiment of the present invention.

Turning first to FIG. 2, there is provided a schematic block diagram of a mobile radio communications device comprising a cellular phone handset 10 including an internal crystal oscillator 12 for producing a clock signal and which can be controlled to run at different frequencies depending upon the frequency of the over-the-air signals received in accordance with different RATs. The diagram of the handset 10 is based upon an illustration of a current handset and its related functionality, but with additional features according to the present invention also illustrated.

The handset 10 of the illustrated embodiment comprises a dual-mode handset in that it is arranged to operate in accordance with two radio access technologies. However, it should be appreciated that the present invention is equally applicable to a multimode handset and the illustration of a dual-mode handset is merely for simplicity.

That is, the handset 10 includes, as with a current handset, a first RAT system 14 and a second RAT system 16 each of which includes respective AFCs 18, 20 which, by way of control lines 22, 24, 26 serve to control the frequency of operation of the oscillator 12.

The control loop offered by each AFC 18, 20 is completed by an output from the oscillator 12 which is delivered by way of a control line 28 to both RAT systems 14 and 16.

With regard to the additional features according to the present invention however, there is provided a separate module, independent from both RAT systems 14, 16 and which comprises a search frequency controller 30 arranged to control the frequency of the oscillator 12 during an initial search procedure, i.e. until the identification of a RAT network to which the device 10 is to attempt a camp-on procedure.

The search frequency controller 30 provides frequency control to the oscillator 12 during the initial search procedure by way of control lines 32, 26.

Additionally, direct communication to the respective RAT systems 14, 16 is provided by way of communication channels 34, 36 respectively for transfer, in particular, of a seed clock value to either of the RAT systems 14, 16, and for request/notification of AFC frequency changes during the search.

As is described in further detail below, inasmuch as a master RAT will supply a clock value as a seed value to the slave RAT during handover between the RAT systems, the present invention advantageously arranges for the search frequency controller 30 to provide, subsequent to the initial search procedure, a clock value as a seed value to which ever of the RAT systems 14, 16 of the handset 10 is to attempt to camp-on.

Thus, the handset 10 of the present invention can perform a relatively time and power efficient initial search procedure which is not prejudiced by the inherent differences between the initial network search techniques of the two RAT systems 14, 16.

Figure 3:
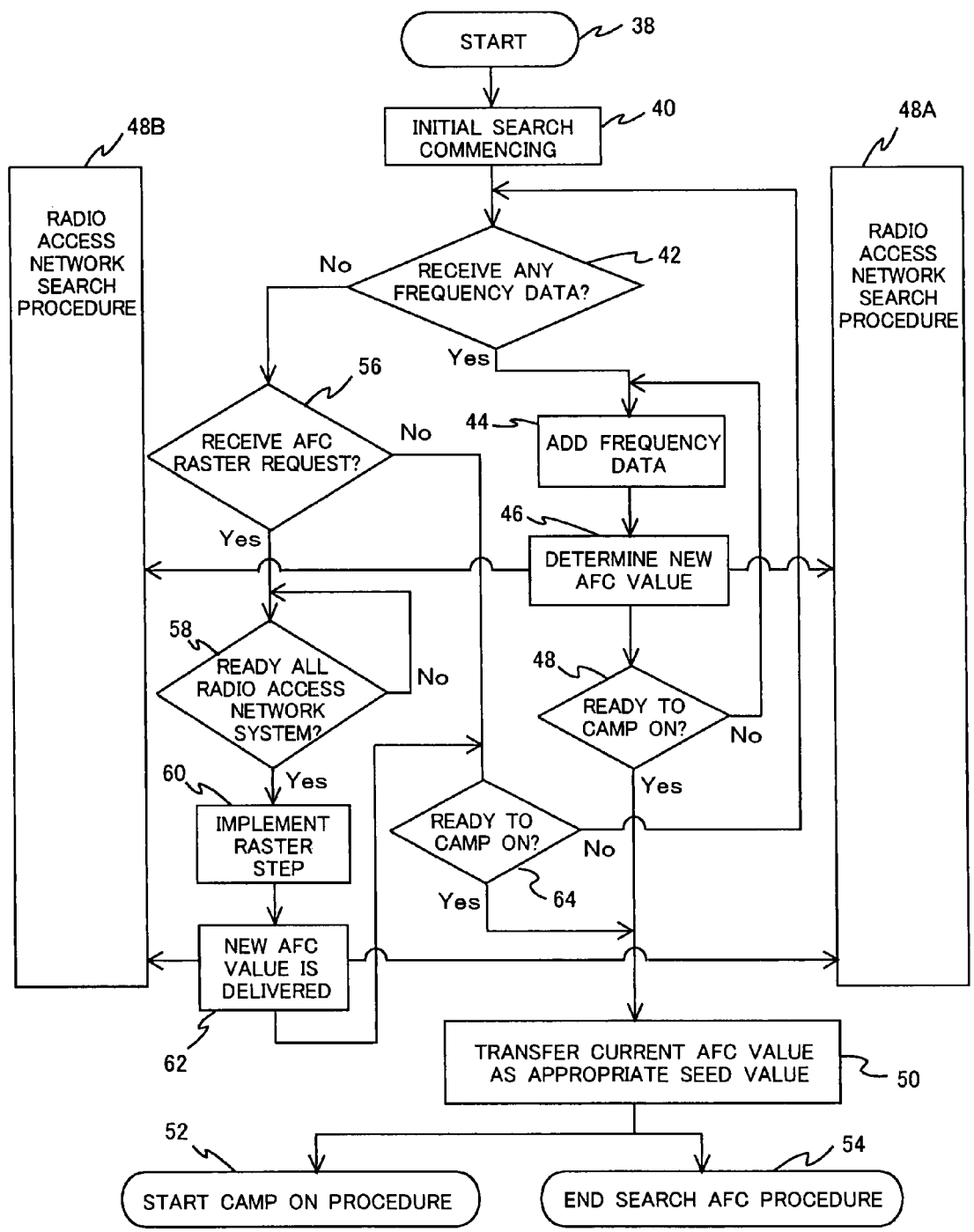
FIG. 3 is a flow diagram illustrating a network search procedure according to an embodiment of the present invention and in relation to a dual-mode device handset.

The operation and methodology of the present invention is described further with reference to FIG. 3.

As will be appreciated with reference to the illustrated embodiment, for normal operation i.e. when camped-on to one of the two RAT systems 14, 16, the existing AFC loops 18, 20 are retained. The additional AFC loop 30 provided by the search frequency controller of FIG. 2 proves particularly advantageous for interleaved acquisition procedures.

The new AFC does not form part of the existing system and can comprise a dual or multimode module. When first activated, the search frequency controller 30 is set to the nominal (usually 0 ppm) correction value. Importantly, the loop moves away from this value in response to either; a system producing a valid frequency error reading and reporting this to the search frequency controller module; or the receipt of a request for a raster step from one of the systems.

In either of these cases, a message can be sent to all systems notifying them of the change.

As a further aspect, all frequency data is fed into the same averaging algorithm, regardless of the RAT system it originated from. However the algorithm can be arranged to allow provision for weighting data according to its origin to compensate for some RATs being inherently more accurate than others.

In response to a valid frequency reading being received from one system, any further raster step requests will be refused and notification will be provided to the requesting system.

If a system has a raster request refused, the system originating that request can be arranged to perform one further pass through the possible channels and, if no active cells are found, to then discontinue the search on that RAT. However, a raster request will only be refused if another system has produced valid frequency data and, if so, the AFC setting is updated to reflect this. Again and as noted above, once there is a valid frequency setting from one of the RATs, it is dictated that the same setting will also be valid for all RATs.

Thus one further pass through the channels (after the known AFC value is applied) is all that is required to ensure that all possible cell frequencies are covered.

In order to allow for the situation where more than one system uses raster steps, a single raster interval is specified. The search AFC module represented by the search frequency controller 30 is aware of which RATs require rastering, and a step will not be implemented until all RATs requiring a raster step have requested it. This ensures that a step is not taken in the middle of a search procedure on any system. To support this there are two other possible responses to a step request (in addition to the refusal message mentioned above).

First, a "step implemented" response which tells the system that it can immediately continue its search.

Secondly, a "step queued" response which is intended to signal to the RAT system that it cannot yet continue to search. Such a response will normally be followed at a later time by the "step implemented" message.

When the search is completed and it is time to attempt camp-on, AFC control is handed over from the search frequency controller to the AFC loop 18 or 20 within the system to which camp-on is to be attempted. At this point the normal master/slave RAT situation begins, with the master RAT AFC setting starting with a seed value being which is the final value used by the search frequency controller 30.

It should be appreciated that, as discussed herein, the invention exhibits particular advantages over the known AFC mechanism in that it allows for interleaved searches of greater time efficiency to be used, and it inhibits unnecessary rastering and repeat searches.

Both of these features lead to significant savings in the time taken for the initial search, and so serve to reduce power consumption and user frustration.

Turning to FIG. 3 there are illustrated the steps of a search method employed within the present invention.

Figure 1:
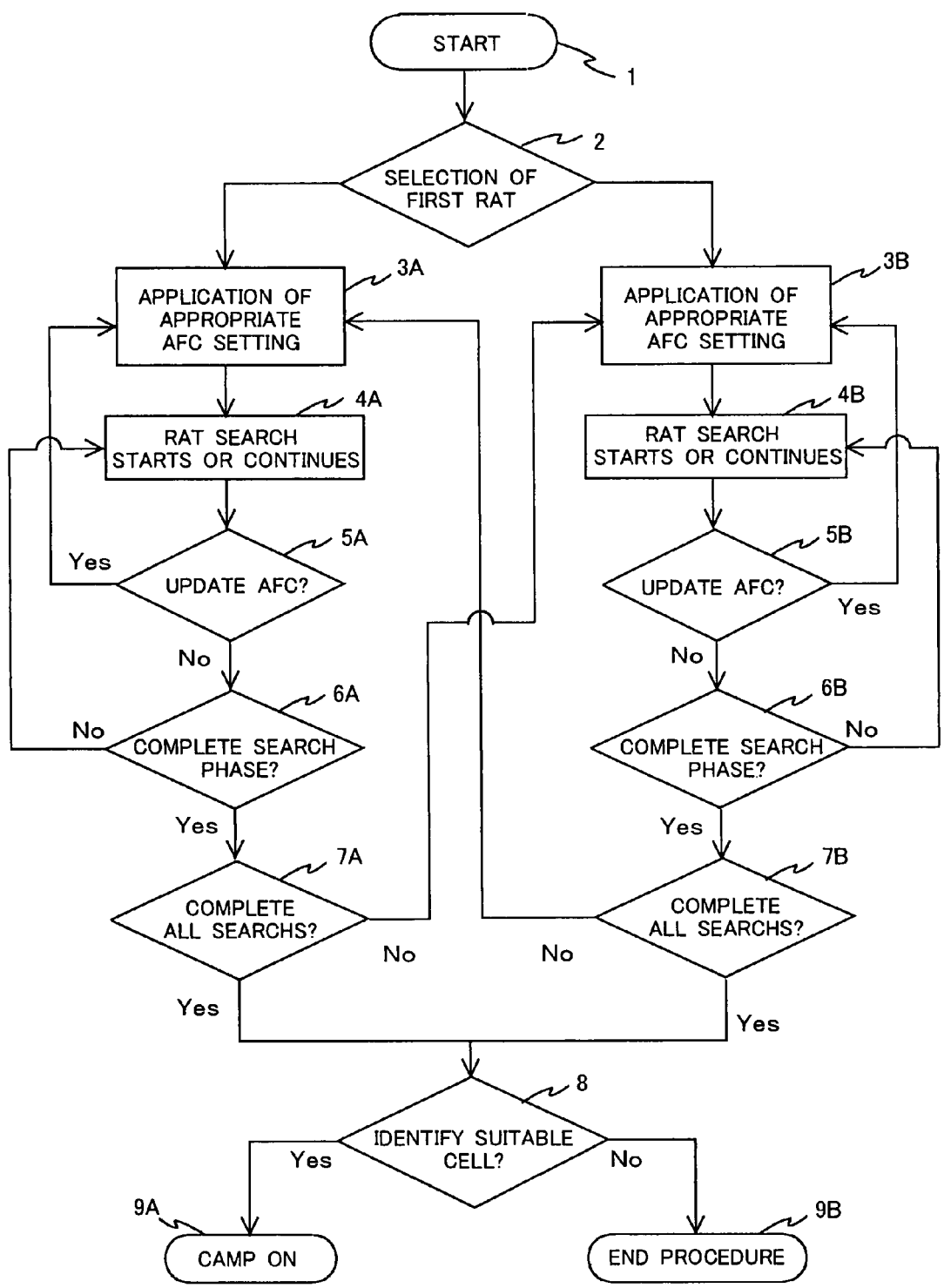
FIG. 1 is a flow diagram illustrating currently known search procedures according to the current art in accordance with two RATs.

The method commences at step 38 with the cellular phone handset 10 of FIG. 1 being activated and the initial search commencing as indicated at step 40 by way of the search frequency controller 30 of FIG. 2 with an initial nominal setting (usually 0 ppm). Such an initial nominal setting of 0 ppm serves to confirm that, at the start of the search procedure, there is no control of a correction value by AFC and such as is later applied to the clock signal.

Next, at step 42, it is determined whether any frequency data has been received from a RAT and, if so, the process continues as indicated to step 44 where the frequency data is added, as appropriate, to any previous data in order to arrive at an average value. As indicated at step 46, and the arrows leading therefrom, if a new AFC value can be determined, it is delivered to the radio access network systems embodying respective search procedures indicated at steps 48A, 48B. Also, a determination is made at step 48 as to whether the handset 10 of FIG. 2 is ready to camp-on to the network located and, if a positive determination is made, the process continues as illustrated to step 50 where the current AFC value established in the search frequency controller 30 is transferred as an appropriate seed value to the radio access network AFC of the appropriate one of the radio access network AFC controllers 18, 20 of FIG. 2. The radio access camp-on procedure then formally commences at step 52, and at step 54 the formal AFC search procedure ends.

Once the search procedure has been concluded the usual master/slave relationship can be established for the RAT systems 14, 16 within the handset 10.

Returning to step 48, if it is there determined the handset 10 is not ready to camp-on to a network, then the procedure returns to step 44 for the addition of new data in an attempt to arrive at appropriate average value for the frequency measurement concerned.

Referring back further to step 42, if it is determined here that no frequency data is yet received from any RAT, a determination is made at step 56 as to whether an AFC raster request has been received. If such a request has been received then, as indicated, the process continues to step 58 where a determination is made as to whether all radio access network systems are ready for a raster step. If they are, then at step 60, a raster step is implemented and, at step 62, the new AFC value is delivered to both the radio access network search procedures 48A, 48B, and also to a determination at step 64 as to whether the handset 10 is ready to camp-on to the network.

As will be appreciated, AFC raster is employed so as to provide for repeated frequency scans at differing ppm accuracy/correction values as part of the search procedure.

As with step 48, if the handset 10 is considered ready to camp-on to the network, then the procedure can continue via steps 50, 52 and 54 so as to transfer the seed clock value to determine within the search frequency controller 30 to the Master RAT and, subsequently, the camp-on procedure starts and the search AFC procedure ends.

If, however, at step 58 it was determined that not all of the radio access network systems identified are ready for a raster step, the procedure returns to repeat such a determination.

Turning back further to step 56, if it is there determined that no AFC raster request has been received, then the procedure continues to step 64 and the determination as to whether the handset 10 is ready to attempt camp-on to the network.

It should be noted that, once a positive determination of valid frequency data has been made at step 42, the frequency raster consideration of step 56 is not applicable for the remainder of the current search.

As discussed above in detail, there is a variety of advantages related to the present invention with regard to potentially significant power savings and related extension in battery life.

Such savings will be particularly noticeable in situations where the handset is normally out of network coverage so that a wide variety of searches may be required.

As will also be appreciated, advantages of the present invention arise in particular if it is employed with an interleaved search procedure for a dual-mode handset.

Yet further the invention can merely comprise a search frequency controller for controlling the internal clock of a mobile radio communications device arranged for communication by way of at least two RATs, the controller being arranged to be initiated at a nominal correction value at the start of the search procedure, and to depart from the said nominal value responsive to one of a receipt of a valid frequency error reading, or receipt of a request for a raster step.

It should be appreciated that while the advantages available by way of the present invention are most pronounced with, for example, two RATs operating according to respective different internal clock frequencies and with different accuracies, the present invention is in fact not so limited.

It is apparent that the present invention is not limited to the above embodiment, but may be modified and changed without departing from the scope and spirit of the invention.

What is claimed is:

1. A mobile radio communications device arranged for communication by way of at least two Radio Access Technology (RATs), said device comprising:
    at least first and second RAT systems and related respective automatic frequency controls for control of an internal clock of the device; and
    a search frequency controller for controlling the internal clock during an initial network search, said search frequency controller configured to have sole control of a single automatic frequency control setting during the initial network search, the search frequency controller being independent of the automatic frequency controls of the at least first and second RAT systems such that, during the initial network search, the search frequency controller:
        obtains an initial automatic frequency control setting;
        determines a current search status on the at least first and second RAT systems based on the obtained AFC value;
        sets the automatic frequency control setting according to the current search status; and
        transfers the automatic frequency control setting to one of the at least first and second RAT systems, which has been set as an active RAT system,
    wherein after the initial network search, the internal clock is controlled by the one of the at least first and second RAT systems, which has been set as the active RAT system.

2. A device as claimed in claim 1, wherein the search frequency controller is arranged to be initiated at a nominal correction value at a start of the initial network search and to depart from the nominal value responsive to receipt of a valid frequency error reading.

3. A device as claimed in claim 1, wherein the search frequency controller is arranged to be initiated at a nominal correction value at a start of the initial network search and to depart from the nominal value responsive to receipt of a request for a raster step.

4. A device as claimed in claim 1, wherein the search frequency controller comprises an AFC module separate from the first and second RAT systems.

5. A device as claimed in claim 3, wherein the nominal correction value comprises 0 ppm.

6. A device as claimed in claim 3, wherein the device is arranged so as to report to the first and second RAT systems upon departure of the search frequency controller from the nominal value.

7. A device as claimed in claim 1, wherein the device is arranged to employ a common algorithm into which frequency data is input for both the first and second RAT systems.

8. A device as claimed in claim 1, wherein the device is arranged such that, upon completion of the initial network search, AFC control is transferred to a RAT system to which camp-on of the device is to be attempted, and
    wherein a frequency value of the search frequency controller serves as a seed value for an AFC setting of the RAT to which camp-on is to be attempted.

9. A device as claimed in claim 3, wherein the search frequency controller is arranged to refuse any further raster-step requests should a valid frequency reading be received from a RAT system.

10. A device as claimed in claim 9, wherein the device is arranged to be responsive to the refusal of a raster request so as to control the RAT system from which the refused request originated to perform a further pass through possible channel frequencies to confirm a presence/absence of active cells.

11. A device as claimed in claim 9, wherein the device is arranged to perform a single raster interval step irrespective of a number of RAT systems that employ raster search procedures.

12. A method of controlling a frequency of an internal clock of a mobile radio communications device arranged for communication by way of one of at least two Radio Access Technology (RATs) and having at least first and second RAT systems and related respective automatic frequency controllers for control of the internal clock of the device, the method including:
- activating a search frequency controller configured to have sole control of a single automatic frequency control setting during an initial search procedure; and
- controlling a clock frequency of said internal clock during the initial search procedure in a manner independent of the automatic frequency controllers of the first and second RATs such that, during the initial search procedure, the search frequency controller:
  - obtains an initial automatic frequency control setting;
  - determines a current search status on the at least first and second RAT systems based on the obtained AFC value;
  - sets the automatic frequency control setting accordin to the current search status; and
  - transfers the automatic frequency control setting to one of the at least first and second RAT systems, which has been set as an active RAT system,
- wherein after the initial network search, the internal clock is controlled by the one of the at least first and second RAT systems, which has been set as the active RAT system.

13. A method as claimed in claim 12, wherein the clock frequency during the initial search procedure is initiated at a nominal correction value at a start of the search procedure, and departs from the nominal value responsive to receipt of a valid frequency error reading.

14. A method as claimed in claim 12, wherein the clock frequency during the initial search procedure is initiated at a nominal correction value at a start of the search procedure, and departs from the nominal value responsive to receipt of a request for a raster step.

15. A method as claimed in claim 13, wherein the nominal correction value comprises 0 ppm.

16. A method as claimed in claim 13, further comprising reporting to the first and second RAT systems upon determination of a departure from the nominal value.

17. A method as claimed in claim 12, wherein frequency data is input into a common algorithm for both the first and second RAT systems.

18. A method as claimed in claim 17, further comprising weighting frequency data within the algorithm and responding to a RAT of origin.

19. A method as claimed in claim 12, wherein upon completion of the initial search procedure, AFC control is transferred to a RAT system to which camp-on of the device is to be attempted.

20. A method as claimed in claim 14, further comprising refusing any further raster-step requests should a valid frequency reading be received from one RAT system.

21. A method as claimed in claim 20, further comprising responding to refusal of a raster request so as to control the RAT system from which the refused request originated to perform a further pass through the possible channel frequencies to confirm a presence/absence of active cells.

22. A method as claimed in claim 21, further comprising discontinuing the search if no further active cells are identified.

23. A method as claimed in claim 20, wherein only a single raster interval step is performed irrespective of a number of RATs systems that employ raster search procedures.

24. A method as claimed in claim 23, further comprising controlling the search frequency controller so as to implement a raster interval step should the first and second RATs have requested the step.

* * * * *